(12) United States Patent  
Muhammad et al.

(10) Patent No.: US 8,781,026 B2  
(45) Date of Patent: Jul. 15, 2014

(54) DIGITAL QUADRATURE TRANSMITTER USING GENERALIZED COORDINATES

(71) Applicant: MStar Semiconductor, Inc., Hsinchu Hsien (TW)

(72) Inventors: Khurram Muhammad, Garland, TX (US); Bernard Ginetti, Antibes (FR); Dennis Mahoney, Greensboro, NC (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/669,693

(22) Filed: Nov. 6, 2012

(65) Prior Publication Data

US 2014/0126671 A1 May 8, 2014

(51) Int. Cl.
*H04L 27/36* (2006.01)
(52) U.S. Cl.
USPC .......................................... 375/298; 332/103
(58) Field of Classification Search
USPC .................................... 375/261, 298; 332/103
See application file for complete search history.

(56) References Cited

U.S. PATENT DOCUMENTS

| 8,054,912 | B2 | 11/2011 | Ba et al. | |
|---|---|---|---|---|
| 2006/0255996 | A1* | 11/2006 | Li et al. | 341/156 |
| 2006/0291589 | A1 | 12/2006 | Eliezer et al. | |
| 2012/0063496 | A1* | 3/2012 | Giannini et al. | 375/221 |
| 2012/0288018 | A1* | 11/2012 | Osman et al. | 375/259 |
| 2013/0251068 | A1* | 9/2013 | Boos et al. | 375/302 |

* cited by examiner

*Primary Examiner* — Curtis Odom
(74) *Attorney, Agent, or Firm* — Edell, Shapiro & Finnan, LLC

(57) ABSTRACT

In one embodiment, a sequence of a plurality of pairs of in-phase (I) and quadrature (Q) modulated signal samples are applied to a radio frequency digital-to-analog converter (RF-DAC) for upconversion. A phase of a local oscillator (LO) signal supplied to the RFDAC is selected according to a quadrant determined by signs of a given pair of I and Q modulated signal samples. The selected phase of the LO is supplied to the RFDAC for use in upconverting the sequence of I and Q modulated signal samples. In another embodiment, a current steering DAC is used for directly upconverting the I and Q modulated signal samples. A clock signal at four times the LO frequency is supplied to a counter and to the current steering DAC. One of the I and Q modulated signal samples and negative I and negative Q modulated signal samples is selected for supply to an input of the current steering DAC based on a count state of the counter.

17 Claims, 9 Drawing Sheets

US 8,781,026 B2

DIGITAL QUADRATURE TRANSMITTER USING GENERALIZED COORDINATES

TECHNICAL FIELD

The present disclosure relates to digital modulation of signals.

BACKGROUND

Digital intensive techniques are useful to build wireless and wireline transmitters in deep-submicron processes. When high output powers with low noise are desired over a wide bandwidth signal, traditional linear in-phase (I)-quadrature (Q) modulator based techniques become challenging at low voltages. To produce a high amount of linear output power while operating at a low supply voltage is difficult for a class A or class AB amplifier. Furthermore, these amplifiers are not very efficient.

In contrast, digital power amplifiers (DPAs) use class-E type operation to produce output power. DPAs produce more or less output power by turning on more or fewer transistors. The number of transistors turned on or off determines the output signal magnitude as well as the output power. FIG. 1 shows a traditional IQ upconverter 5 comprising two mixers 10, 12 followed by an adder 14. The mixer 10 is driven by a local oscillator (LO) signal for the I modulated data, e.g., $LO_I$, and the mixer 12 is driven by a LO signal for the Q modulated data, e.g., $LO_Q$. The I/Q upconverter 5 is followed by a traditional power amplifier (PA) driver or a PA. The output signal is upconverted to radio frequency (RF) and fed to the class A or class AB PA driver (or a PA) that drives the output.

The upconversion principle can be mathematically described as $rf(t)=\{I(t)+jQ(t)\}e^{j\omega_c t}$ that is, a frequency translation of the spectrum of the complex modulation signal $I(t)+jQ(t)$ using a complex exponential waveform ($\cos \omega_c t + j \sin \omega_c t$), where $\omega_c=2\pi f_c$. Digital signal processing techniques have allowed for development of more precise upconversion modulation schemes.

SUMMARY

According to one embodiment, a sequence of a plurality of pairs of in-phase (I) and quadrature (Q) modulated signal samples are applied to a radio frequency digital-to-analog converter (RFDAC) for upconversion by a digital quadrature transmitter. A phase of a local oscillator signal supplied to the RFDAC is selected according to a quadrant determined by signs of a given pair of I and Q modulated signal samples. The selected phase of the local oscillator signal is supplied to the RFDAC for use in upconverting the sequence of I and Q modulated signal samples.

According to another embodiment, a current steering DAC is used for directly upconverting the I and Q modulated signal samples. Negative I and negative Q modulated signal samples are generated from the I and Q modulated signal samples. A clock signal at four times a local oscillator signal frequency is supplied to a counter and to the current steering DAC. One of the I and Q modulated signal samples and negative I and negative Q modulated signal samples is selected for supply to an input of the current steering DAC based on a count state of the counter.

DESCRIPTION OF EXAMPLE EMBODIMENTS

Figure 1:
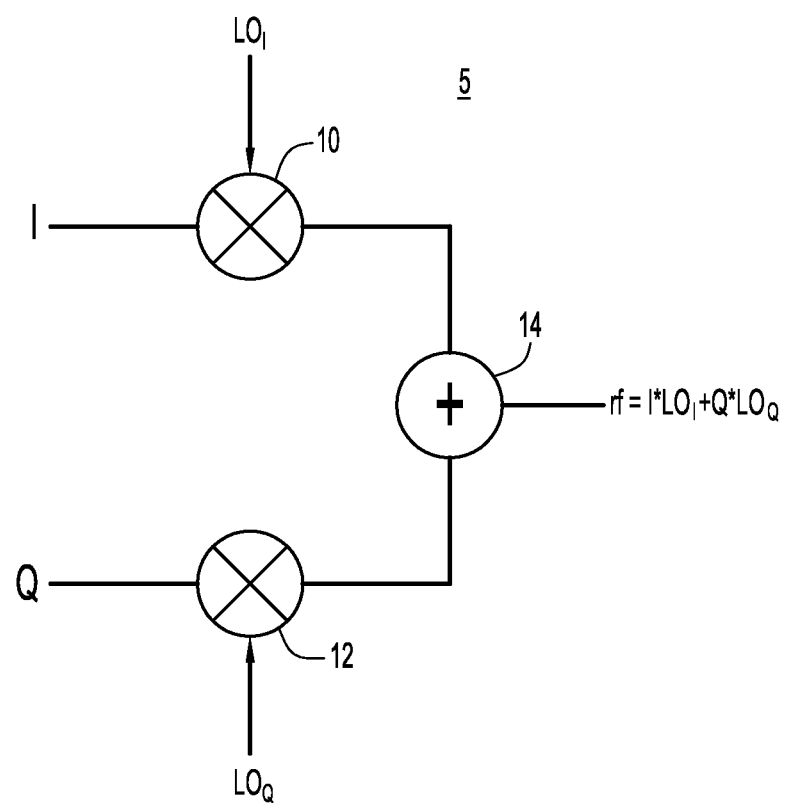
FIG. 1 is a block diagram of a conventional upconverter that is followed by a conventional power amplifier driver or power amplifier.

The present inventive concepts are best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, mathematical expressions are contained herein and those principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

Figure 2:
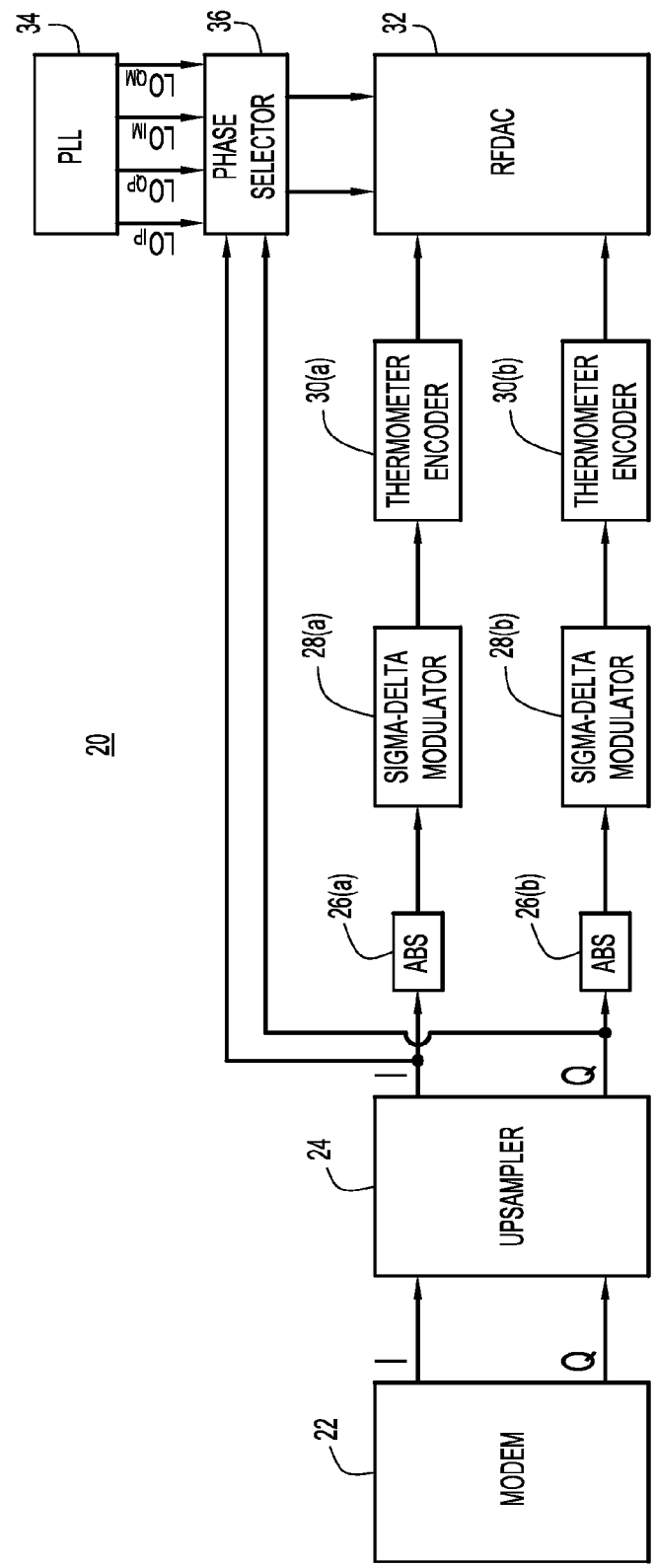
FIG. 2 is a block diagram of a digital upconversion system according to one embodiment.

Referring to FIG. 2, an example block diagram is shown of a digital IQ upconversion system 20 based on a 25% duty cycle LO. The output of an upconversion process using a 25% duty cycle LO produces the sequence in-phase (I), quadrature (Q), −I, −Q, I, Q, −I, −Q, and so on. The rate of change of I and Q is related to the modulation bandwidth of the signal, which is 200 kHz for Global System for Mobile Communication (GSM) modulation and 20 MHz for Long Term Evolution (LTE) signals. The output sequence produced at the upconversion mixer changes at the rate of four times the rate (frequency) of the LO (4LO). This upconversion can be performed using a radio frequency digital-to-analog converter (RFDAC) that provides this sequence at its output, thereby translating the input signal to an output carrier frequency. Hence, the function of the mixers 10,12 and adder 14 of the upconverter 5 in FIG. 1, followed by a PA driver (or a PA), can be replaced by a combined mixer and PA driver using an RFDAC. Moreover, as will become apparent hereinafter, the function of the adder 14 in the upconverter 5 of FIG. 1 is effectively moved or performed before the mixing operations.

Figure 5:
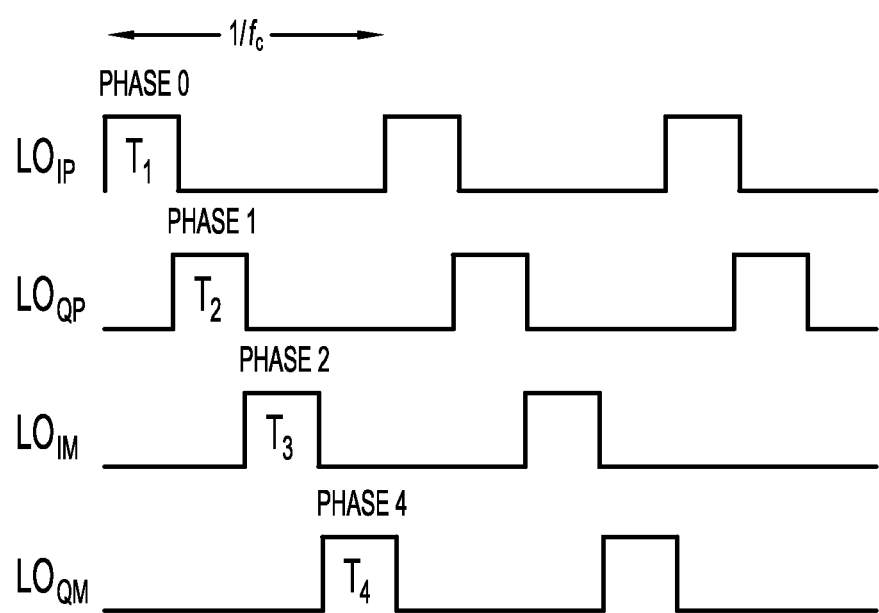
FIG. 5 illustrates a timing diagram of a 25% duty cycle LO waveform, whose phase is selected for supply to the RFDAC shown in FIG. 3.

The digital IQ upconversion system 20 comprises a modem 22, an upsampler 24, absolute value computation blocks (Abs) 26(a) and 26(b) for the I and Q signal paths, respectively, sigma-delta modulators 28(a) and 28(b) for the I and Q signal paths, respectively, thermometer encoders 30(a) and 30(b) for the I and Q signal paths, respectively, and an RFDAC 32. The RFDAC 32 may take on the form as shown in FIG. 5, described hereinafter. A Phase Lock Loop (PLL) 34 supplies a plurality of LO signal phases for the positive (P) and negative/minus (M) sides of the RFDAC 32, e.g., $LO_{IP}$, $LO_{IM}$, $LO_{QP}$ and $LO_{QM}$. A phase selector block/unit 36 is coupled to the PLL 34 and to the RFDAC 32, and selects one of the plurality of LO phases depending on values for a given pair of I and Q signals, as described hereinafter.

The modem 22 outputs modulated signals in the form of I and Q modulated signals. The upsampler 24 increases the sampling rate of the I and Q modulated signals to produce I and Q modulated signal samples at a sampling rate greater than that output by the modem 22. The Abs blocks 26(a) and 26(b) compute absolute values of the I and Q modulated signal samples, respectively. The sigma-delta modulators 28(a) and 28(b) increase the resolution of the I and Q modulated signal samples, respectively. Thus, the outputs of the sigma-delta modulators 28(a) and 28(b) are referred to as resolution increased versions of the I and Q modulated signal samples, respectively. Any time-dithering method may be used to increase the resolution of the I and Q modulated signal samples. A sigma-delta modulator shapes the output quantization noise in order to meet noise specifications at large offsets from a carrier frequency.

For example, the sigma-delta modulators 28(a) and 28(b) each time-dithers only one least significant bit (LSB) (corresponds to one transistor device, also known as a "cell", in the RFDAC 32), though the LSB may be rotated with the data using any known approach. As an example, the LSB can be one of many cells in an independent row or column. The LSB may be rotated within the row or column using a randomization sequence such as dynamic element matching (DEM). Alternatively, the LSB could be the last bit selected by the signal code. That is, if the code applied is 7, the 7th cell is selected to be time-dithered. When the code applied is 22, for example, the 22nd cell is selected to be time-dithered to produce the fractional value in order to increase the resolution.

In order to address output spectrum requirements at certain frequency offsets, finite impulse response (FIR) nulls can be placed to resolve the bands causing such violations. Another approach is to use a sigma-delta modulator that provides nulls at programmed frequency offsets. This is done by adding/placing zeros in the quantization noise transfer function.

A different time-dithering approach may be used that does not emphasize the quantization noise at higher frequency offsets. In any case, the sigma-delta modulators 28(a) and 28(b) produce resolution-increased versions of the I and Q modulated signal samples, respectively, by virtue of the time-dithering operations they perform on the I and Q modulated signal samples, respectively.

The thermometer encoders 30(a) and 30(b) translate the I and Q modulated signal samples, respectively, to thermometer coded outputs that are used to select zero or more transistors (cells) in the RFDAC 32. A "zero" I or Q value maps to selection of no transistors in the RFDAC and a maximum I or Q input corresponds to selection of all transistors in the RFDAC, and an I or Q value between zero and the maximum will select a corresponding subset of the cells, as described further hereinafter. Other encoders are possible, such as a binary encoder.

Figure 3:
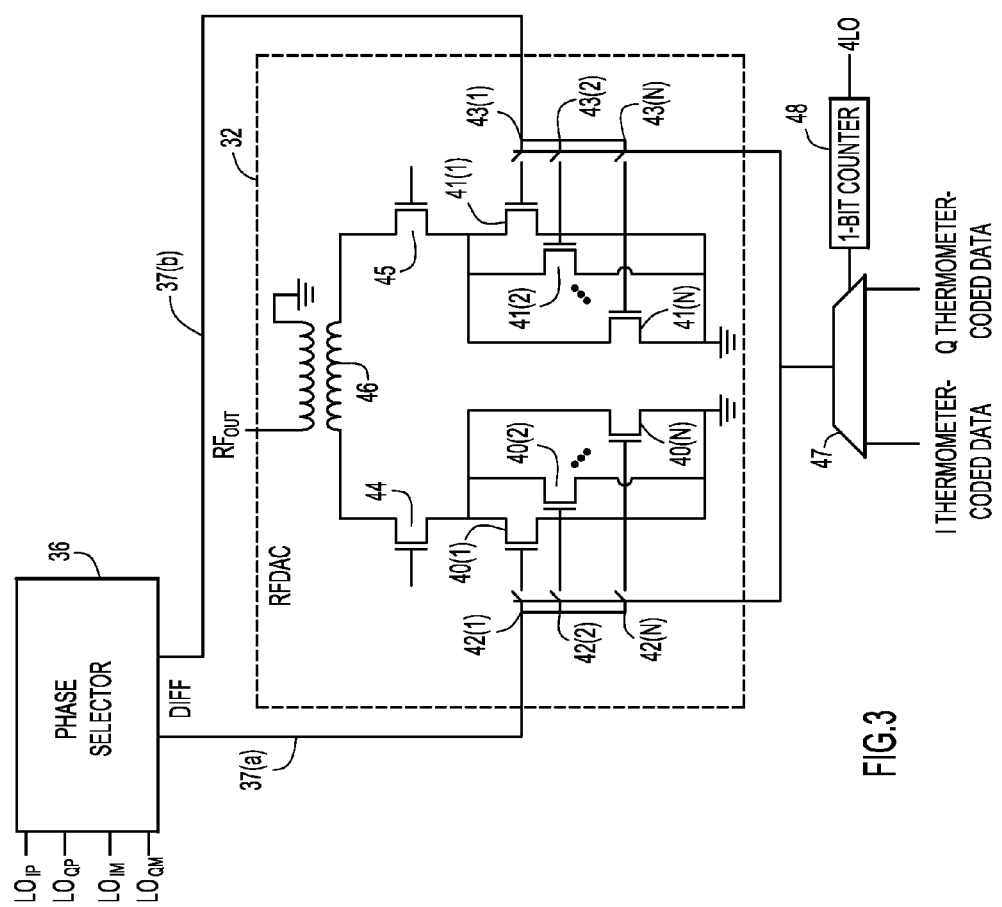
FIG. 3 is an example of a schematic diagram of a radio frequency digital-to-analog converter (RFDAC) coupled to a phase selector configured to select an appropriate phase of a LO signal to the RFDAC.

Unlike a binary-coded DAC, a thermometer encoder implements each cell with the same size to ensure that there are no spurious emissions or glitches when the code rolls over from, e.g. 3 to 4, 7 to 8, 15 to 16 etc., which would occur in a binary-coded DAC, where a number of bits are turned off and a higher weighted cell is turned on. Mismatches can cause severe dynamic noise level problems that appear as a spectral violation at the output. An example schematic diagram of the RFDAC 32, coupled to the phase selector 36 and to outputs from the thermometer encoders 30(a) and 30(b) is shown in FIG. 3. The RFDAC 32 comprises a plurality of transistors 40(1)-40(N) on the positive side and a plurality of transistors 41(1)-41(N) on the negative (minus) side. There are a plurality of switches 42(1)-42(N), each of which is coupled to a corresponding one of the plurality of transistors 40(1)-40(N), respectively, and a plurality of switches 43(1)-43(N) each of which is coupled to a corresponding one of the plurality of transistors 41(1)-41(N). The RFDAC 32 also includes a bias transistor 44 for the positive side, a bias transistor 45 for the minus side, and transformer 46, from which the RF output is taken. The RF output of the RFDAC 32 can be coupled to an antenna for transmission of a signal (e.g., over the air).

The amount of current that flows through the output load (to the transformer 46) is proportional to the number of transistor devices turned on. The transistors 40(1)-40(N) are turned on by closure of the respective switches 42(1)-42(N) on the positive side and the transistors 41(1)-41(N) are turned on by closure of the respective switches 43(1)-43(N) on the negative side. These switches are controlled by the outputs of either of the thermometer encoders 30(a) and 30(b). Specifically, the I thermometer-coded data (from thermometer encoder 30(a)) and the Q thermometer-coded data (from thermometer encoder 30(b)) are supplied to inputs of a multiplexer 47. A one-bit counter 48, driven by a clock at 4 times the LO frequency, controls the multiplexer 47 to switch between the I thermometer-coded data and the Q thermometer-coded data. For example, when the value of the counter 48 is "0", the I thermometer-coded data is output to appropriate ones of the switches 41(1)-41(N) on the positive side and appropriate ones of the switches 43(1)-43(N) on the minus side. When the value of the counter 48 is "1", the Q thermometer-coded data is output to appropriate ones of the switches 41(1)-41(N) on the positive side and appropriate ones of the switches 43(1)-43(N) on the minus side. The number of switches among switches 41(1)-41(N) on the positive side and number of switches among switches 43(1)-43(N) on the minus side that are selected/closed depends on the value of the I or Q thermometer-coded data, in a range between 0 (for which no switches are selected/closed) and a maximum value (for which all switches are selected/closed).

The phase selector 36 supplies differential outputs on signal lines 37(a) and 37(b), where signal line 37(a) is connected to one terminal on each of switches 41(1)-41(N) on the positive side and signal line 37(b) connects to one terminal on each of switches 43(1)-43(N) on the minus side. The inputs to the phase selector 36 are the LO phases from the PLL 34, i.e., $LO_{IP}$, $LO_{QP}$, $LO_{IM}$, $LO_{QM}$. The outputs of the phase selector 36 are differential because when the phase selector 36 selects LOx (X=IP, QP, IM, or QM), that selected phase goes on signal line 37(a) and the opposite phase is output on signal line 37(b) to the minus side. In other words, if the phase selector 36 selects $LO_{IP}$ based on the state of the I/Q data, the phase selector 36 outputs $LO_{IM}$ to minus side on signal line 37(b). Likewise, if the phase selector selects $LO_{IM}$ based on the state of the I/Q data, the phase selector 36 outputs $LO_{IP}$ to the minus side, and so on. Fractional values can be selected by using time-dithering of one or more transistor devices. It is possible to have an implementation with only a plus side of an RFDAC, no negative side. In this case, all four quadrants of the I/Q data are covered, but the output power is reduced by half (or 3 dB). The minus side of the RFDAC adds 3 dB power to the output.

Thus, the upconversion occurs by an "AND" operation of the I/Q data with the appropriate phase of the LO signal that is supplied to terminals of the switches 41(1)-41(N) on the positive side and to terminals of the switches 43(1)-43(N) on the minus side. Hence, $LO_I$ and $LO_{IM}$ signals are gated by the I data and the $LO_{QP}$ and $LO_{QM}$ signals are gated by the Q data.

The I data should be stable before the rising edge of the $LO_I$ signal and remain stable until the falling edge of $LO_I$. In a similar fashion, the Q data should be stable before the rising edge of the $LO_Q$ and remain stable until the falling edge of $LO_Q$. The propagation delays may be time dispersed in any matter. However, when LO goes high and remains high, the number of transistors turned on should remain unchanged. This ensures that the phase noise of the LO determines the spectral performance of the RF output at frequencies greater than the modulation signal bandwidth.

In view of the practical limitations imposed by the RFDAC 32 for generating very low noise outputs, the inputs applied to the RFDAC are modified, according to one embodiment, to be positive only, and an absolute value operation is performed on the I and Q modulated signal samples (which can take on any sign). Thus, the inputs applied to the RFDAC 32, even after encoding by the thermometer encoders 30(a) and 30(b), are |I| followed by |Q| and then back to |I| followed by |Q|, and so on. In other words, I and Q modulated signal samples are applied in a repeating sequence of: the absolute value of the I modulated signal sample, followed by the absolute value of the Q modulated signal sample. The sign information is passed to the phase selector 36 to allow it to select the plus-RFDAC side or minus-RFDAC side based on the I or Q modulated signal samples.

The phase selection is performed by the phase selector block 36. The signs of the I and Q modulated signal samples are no longer needed when the I and Q modulated signal samples are applied to the RFDAC. Therefore, the sign is stripped off by the Abs blocks 26(a) and 26(b). The input applied to the phase selector block 36 is the quadrant information which is used to select the correct phase of the LO. In other words, a phase of the LO signal is selected according to a quadrant determined by signs of a given pair of I and Q modulated (and upsampled) signal samples, and the selected phase of the LO signal is supplied to the RFDAC 32. An example of phase selection is set forth in Table 1 and shown in FIG. 4, where the first quadrant is mapped to Phase 0 and second quadrant is mapped to Phase 1, and so on. A timing diagram for the LO signals is shown in FIG. 5.

TABLE 1

| Example phase selection | |
| --- | --- |
| I and Q Values (Quadrant) | LO Phase Selected |
| I > 0 and Q > 0 | $LO_{IP}$ (Phase 0) |
| I > 0 and Q < 0 | $LO_{QM}$ (Phase 3) |
| I < 0 and Q > 0 | $LO_{QP}$ (Phase 1) |
| I < 0 and Q < 0 | $LO_{IM}$ (Phase 2) |

Figure 4:
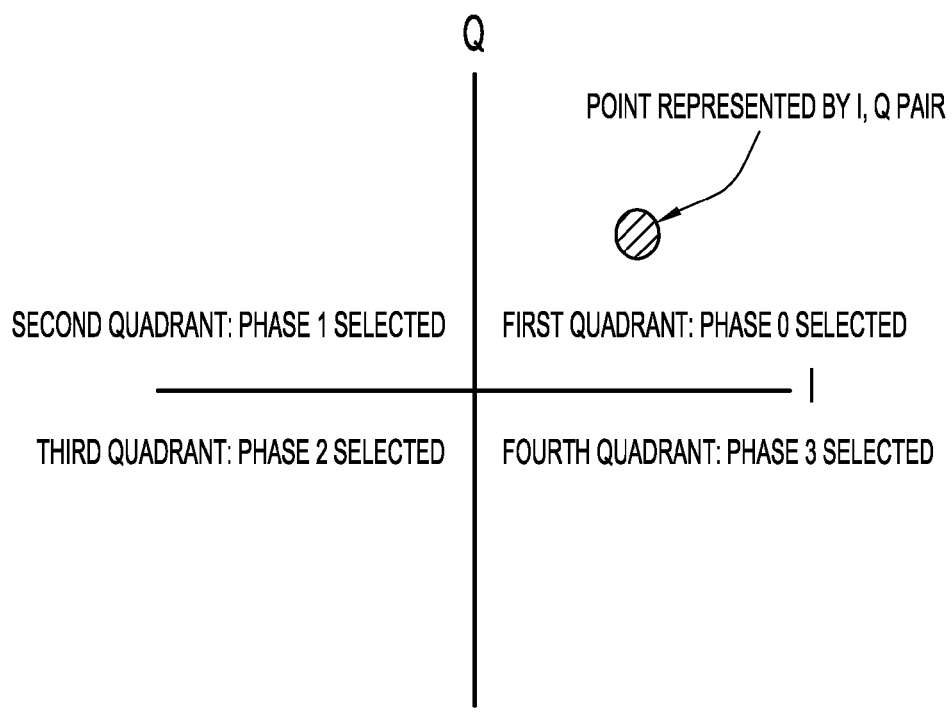
FIG. 4 is a diagram illustrating an example of a mapping between quadrant location of modulated signals and a phase to be selected for a local oscillator signal.

As shown in FIGS. 4 and 5 and depicted in Table 1, in one example, the phase selector block 36 operates to, for a given pair of in-phase and quadrature modulated signal samples:

select a first phase (Phase 0—$LO_{IP}$) when the in-phase modulated signal sample is greater than zero and the modulated quadrature signal sample is greater than zero;

select a second phase (Phase 1—$LO_{QP}$) when the in-phase modulated signal sample is less than zero and the quadrature modulated signal sample is greater than zero;

select a third phase (Phase 2—$LO_{IM}$) when the in-phase modulated signal sample is less than zero and the quadrature modulated signal sample is less than zero; and selecting a fourth phase (Phase 3—$LO_{QM}$) when the in-phase modulated signal sample is greater than zero and the quadrature modulated signal sample is less than zero.

Thus, the phase selector block 36 may be implemented, in one example, by a look-up table (LUT) that maps possible combinations of signs of a pair of I and Q modulated signal samples to a corresponding LO phase.

In summary, the input data (|I| or |Q|) is multiplexed into the RFDAC 32 at the rate of 4 times LO (4LO). The corresponding LO phase is selected by the phase selector 36 and presented to the RFDAC 32. The selected LO phase is used as a gating signal to gate the settled signal data to turn on the required number of transistors on the appropriate RFDAC (plus or minus) side.

Figure 6:
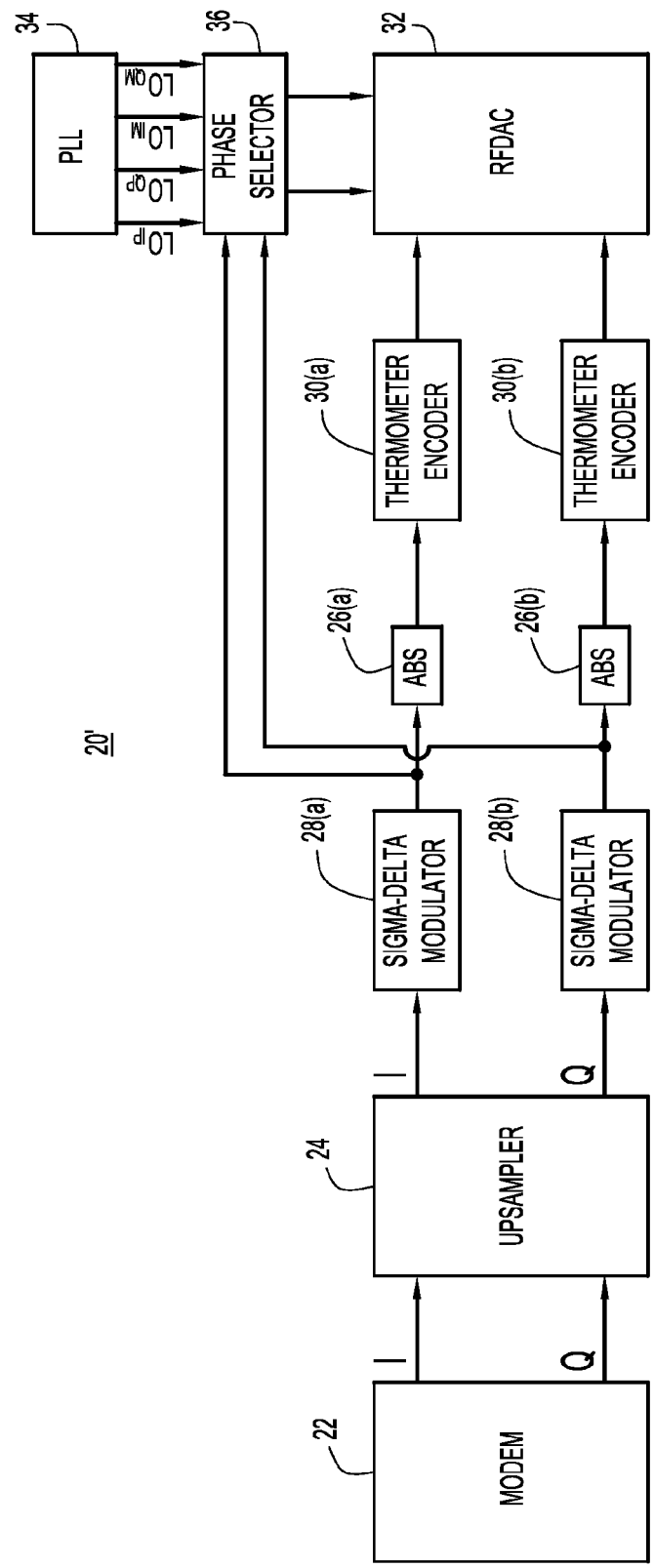
FIG. 6 is a block diagram of a digital upconversion system according to another embodiment.

In the configuration of FIG. 2, the Abs computations of the Abs blocks 26(a) and 26(b) are performed prior to the time-dithering operations of the sigma-delta modulators 28(a) and 28(b). The phase selector block 36 receives as input the I and Q modulated signal samples prior to the absolute value operations of the Abs blocks 26(a) and 26(b) and also before the time-dithering operations of the sigma-delta modulators 28(a) and 28(b). As a result, the time-dithering operations are performed on the absolute values of the I and Q modulated signal samples. This is only an example. FIG. 6 illustrates another configuration of a digital upconversion system, generally shown at reference numeral 20'. In this configuration, the absolute value operations of the Abs blocks 26(a) and 26(b) are performed on the resolution-increased versions of the I and Q modulated signal samples (after the time-dithering operations of the sigma-delta modulators 28(a) and 28(b)). This reduces the latency between the I and Q modulated signal samples and the phase select path to a minimum achievable in the digital signal processing domain. Thus, in the embodiment of FIG. 6, the phase selection is performed on the basis of the resolution-increased version of the I and Q modulated signal samples.

Figure 7:
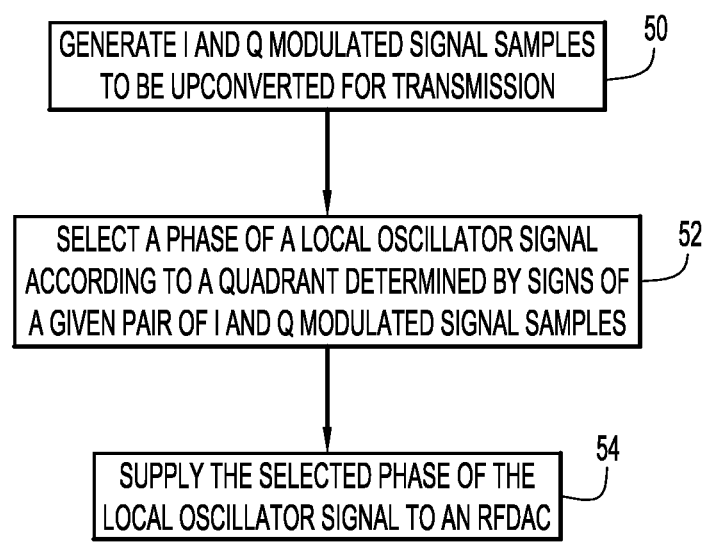
FIG. 7 is a flow chart depicting a method for digital upconversion according to the embodiments of FIGS. 2-6.

Turning now to FIG. 7, a flow chart is shown depicting a digital upconversion method according to the embodiments of FIGS. 2-6. At 50, a plurality of pairs of I and Q modulated signal samples are generated (e.g., by a modem) to be successively applied to an RFDAC for upconversion (in a repeating sequence of: Abs(I) followed by Abs(Q). At 52, a phase of an LO signal is selected according to a quadrant determined by signs of a given pair of I and Q signal samples. At 54, the selected phase of the LO signal is supplied to an RFDAC.

As explained above, the selected LO phase is used as a gating signal to gate the settled I and Q data that turns on the required number of transistors on the appropriate side (positive or minus/negative) of the RFDAC. The RFDAC may comprise a plurality of transistors for a positive RFDAC output and a plurality of transistors for a negative RFDAC output. Accordingly, the phase selecting operation involves selecting a phase of the local oscillator signal to be coupled to one or more of the number of the plurality of transistors for the positive RFDAC output and for the negative RFDAC that are turned on.

Although the foregoing description refers to a 25% duty cycle LO based solution, the techniques described herein are equally valid for a lower duty-cycle non-overlapping LO based system with 90 degree phase separation, as well as for other non-90 degree LO based solutions.

Figure 8:
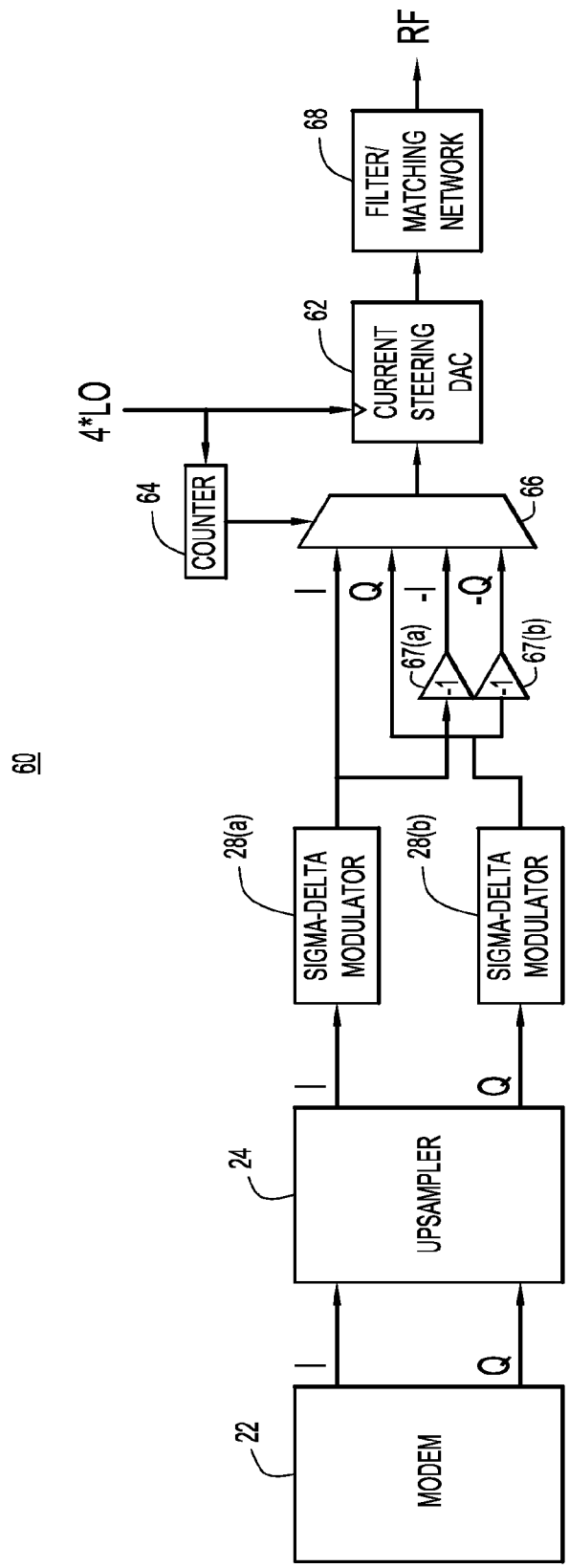
FIG. 8 is a block diagram of a digital upconversion system according to still another embodiment.

Not all applications require upconversion to a very high frequency. For example, it is possible to build current steering DACs that can operate at GHz rates. Reference is now made to FIG. 8. FIG. 8 illustrates digital modulation and upconversion system 60 that directly upconverts the modulated signals, even up to 500 MHz. The principles described above in connection with FIGS. 4-7 can be used to directly drive a current steering DAC that can handle both positive and negative inputs. The system 60 comprises a modem 22 that outputs I and Q modulated signals, upsampler 24 that upsamples the I and Q modulated signals, and sigma-delta modulators 28(*a*) and 28(*b*) coupled to the outputs of the upsampler 24. The current steering DAC 62 receives a repeating sequence I, Q, −I, −Q, via a 2-bit counter 64 and multiplexer 66. Inverters 67(*a*) and 67(*b*) are provided to generate negative I and negative Q modulated signal samples from the I and Q modulated signal samples, respectively. The counter 64 operates at a clock rate of 4LO, and the same clock that is used to clock the counter 64 is also used to clock data into the current steering DAC 62 from the multiplexer 66. The multiplexer 66 selects one of the I and Q modulated signal samples and negative I and negative Q modulated signal samples for supply to the input of the RFDAC based on a count state of the 2-bit counter 64. The multiplexer 66, as a result of the count state of the 2-bit counter 64, outputs the I and Q modulated signal samples to the input of the current steering DAC in the repeating sequence: I, Q, −I, −Q. The data sequence applied automatically upconverts the complex input signal I+jQ to the LO frequency. The system 60 is also useful for a super-heterodyne transmitter to simplify the design of the first upconversion stage. As an example, the system 60 can upconvert the transmit signal directly to approximately 500-600 MHz using a current steering DAC. A following upconversion stage may upconvert this signal to an RF frequency of, for example, 900 MHz, 2.4 GHz or even 60 GHz to implement a super-heterodyne transmitter.

Figure 9:
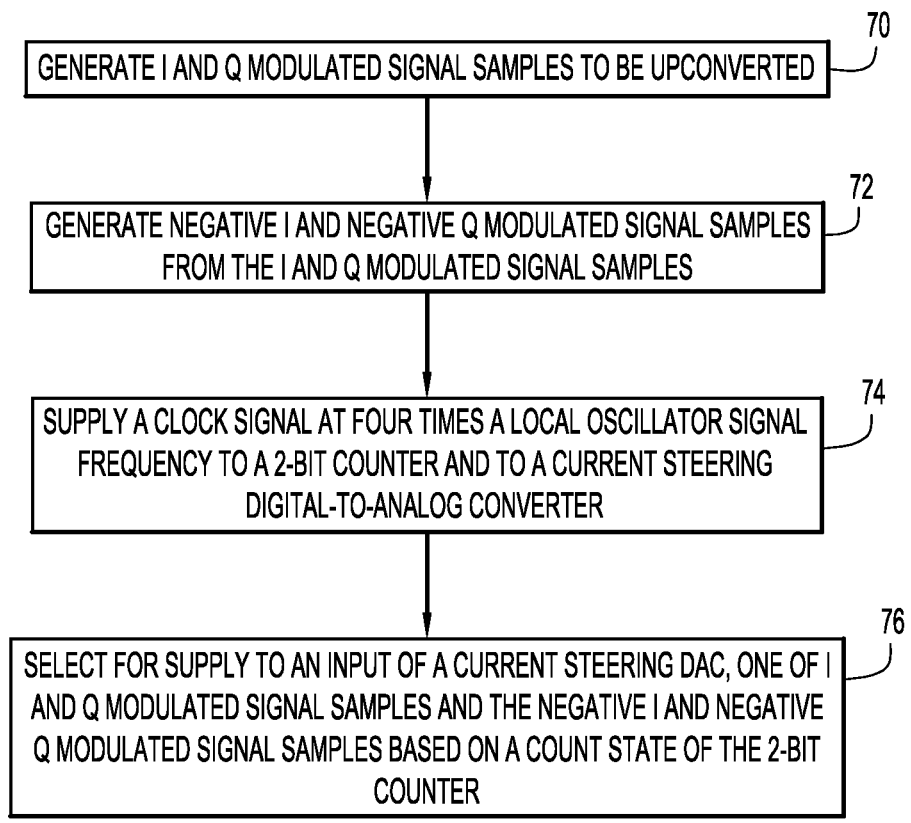
FIG. 9 is a flow chart depicting a method for digital upconversion according to the embodiment of FIG. 8.

FIG. 9 illustrates a flow chart for a digital upconversion method according to the system configuration shown in FIG. 8. At 70, I and Q modulated signal samples are generated, e.g., by a modem, for upconversion. At 72, negative I and negative Q modulated signal samples are generated from the I and Q modulated signal samples. At 74, a clock signal at four times an LO signal frequency is supplied to a 2-bit counter and to a current steering DAC. At 76, one of the I and Q modulated signal samples and negative I and negative Q modulated signal samples is selected for supply to an input of the current steering DAC based a count state of the 2-bit counter. The selecting operation causes application of the in-phase and quadrature modulated signal samples in a repeating sequence: in-phase modulated signal sample, followed by quadrature modulated signal sample, followed by negative in-phase modulated signal sample, followed by quadrature modulated signal sample.

There are several advantages of the signal processing configurations and methods described herein. A digital power amplifier, such as an RFDAC depicted in the FIGS. 2-7, and a current steering DAC depicted in the embodiment of FIGS. 8 and 9, require predistortion in order adjust for the impedance caused by the switching of the transistors. Prior digital IQ modulation schemes involving digital power amplifiers require application of an Abs(I+Q) and Abs(I−Q). Designing predistortion schemes when operating in the Abs(I+Q)/Abs (I−Q) domains is challenging. It has been discovered that when modulated signals in the Abs(I) and Abs(Q) (and −Abs (I) and −Abs(Q)) domain are successively applied to the digital power amplifier, the predistortion schemes needed are much more simplified.

Thus, according to the embodiment depicted in FIGS. 8 and 9, a method in a digital quadrature transmitter is provided comprising steps of generating in-phase and quadrature modulated signal samples to be upconverted; generating negative in-phase and negative quadrature modulated signal samples from the in-phase and quadrature modulated signal samples; supplying a clock signal at four times a local oscillator signal frequency to a counter and to a current steering digital-to-analog converter; and selecting for supply to an input of the current steering DAC, one of the in-phase and quadrature modulated signal samples and the negative in-phase and negative quadrature modulated signal samples based on a count state of the counter.

Likewise, a transmitter is provided comprising a counter configured to receive as input a clock signal that is at four times a local oscillator signal frequency, the counter configured to generate as output a count state; a current steering digital-to-analog converter (DAC) configured to convert a digital input to an analog output based on the clock signal; and a multiplexer configured to receive as inputs in-phase and quadrature modulated signal samples to be upconverted for transmission, and negative in-phase and negative quadrature modulated signal samples derived from the in-phase and quadrature modulated signal samples, and to select for output to an input of the current steering DAC one of the in-phase and quadrature modulated signal samples and negative in-phase and negative quadrature modulated signal samples based on the count state of the counter.

Certain embodiments of the present invention provide for the functional components to be manufactured, transported, marketed and/or sold as processor instructions encoded on non-transitory computer-readable media. For example, one such computer-readable medium (not illustrated) may be provided to a circuit fabrication process carrying processor instructions that, when executed by an Electronic Design Automation (EDA) interface processor, a graphical representation of an embodiment of the present invention is presented to a user, such as on a display device (not illustrated). Through EDA interface, a circuit designer may incorporate the present invention into a larger circuit design. Once a circuit design has been completed, another non-transitory computer-readable medium (not illustrated) carrying other processor instructions, such as a hardware description language, may be provided to a design data realization processor. The design data realization processor may convert the instructions provided thereto into another set of processor instructions, by which a tangible e.g., integrated circuit, may be realized when executed by a circuit fabrication system. Such realization data may include data to construct component and interconnect mask patterns, component placement location data, packaging data, and any other data necessary in a fabrication process to produce the finished circuit product. Other realization data may include milling machine instructions and wiring instruction data, where the specific form of the realization data is dependent on the type of circuit in which the present invention is embodied.

It is to be understood that the computer-readable medium described above may be any non-transitory medium on which the instructions, as well as processor instructions that implement the signal processing operations described herein, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

Thus, with respect to the embodiments depicted in FIGS. 2-7, one implementation may be in the form of a tangible non-transitory computer-readable medium encoded with processor instructions that, when executed by a processor, generates data that, when provided to an electronic circuit fabrication apparatus, fabricates a circuit comprising: a radio frequency digital-to-analog converter (RFDAC) configured to upconvert a plurality of pairs of in-phase and quadrature modulated signal samples that are successively applied to the RFDAC; and a phase selector unit configured to receive a plurality of phases of a local oscillator signal and to select for supply to the RFDAC one of the plurality of phases according to a quadrant determined by signs of a given pair of in-phase and quadrature modulated signal samples.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. A method used in a digital quadrature transmitter, comprising:
   generating a plurality of pairs of in-phase and quadrature modulated signal samples to be successively applied to a radio frequency digital-to-analog converter (RFDAC) for upconversion;
   selecting a phase of a local oscillator signal according to a quadrant determined by signs of a given pair of in-phase and quadrature modulated signal samples;
   supplying the selected phase of the local oscillator signal to the radio frequency digital-to-analog converter (RFDAC) for use in upconverting the in-phase and quadrature modulated signal samples;
   translating the in-phase and quadrature modulated signal samples to thermometer coded outputs that are supplied to inputs of the RFDAC to select transistors to be turned on in the RFDAC; and
   time-dithering the in-phase and quadrature modulated signal samples to produce resolution-increased versions of the in-phase and quadrature modulated signal samples.

2. The method of claim 1, further comprising successively applying the in-phase and quadrature modulated signal samples in a repeating sequence where: an absolute value of the in-phase modulated signal sample is followed by an absolute value of the quadrature modulated signal sample.

3. The method of claim 1, wherein selecting comprises selecting the phase of the local oscillator signal to be used as a gating signal to turn on a number of transistors in the RFDAC based on the in-phase and quadrature modulated signal samples.

4. The method of claim 1, wherein the RFDAC comprises a plurality of transistors for a positive RFDAC output and a plurality of transistors for a negative RFDAC output, and wherein selecting comprises selecting a phase of the local oscillator signal to be coupled to one or more of the plurality of transistors for the positive RFDAC output and for the negative RFDAC output that are turned on.

5. The method of claim 1, wherein selecting comprises selecting one of four phases of a 25% duty cycle local oscillator signal.

6. The method of claim 5, wherein, for a given pair of in-phase and quadrature modulated signal samples, selecting comprises:
   selecting a first phase when the in-phase modulated signal sample is greater than zero and the modulated quadrature signal sample is greater than zero;
   selecting a second phase when the in-phase modulated signal sample is less than zero and the quadrature modulated signal sample is greater than zero;
   selecting a third phase when the in-phase modulated signal sample is less than zero and the quadrature modulated signal sample is less than zero; and
   selecting a fourth phase when the in-phase modulated signal sample is greater than zero and the quadrature modulated signal sample is less than zero.

7. The method of claim 1, wherein time-dithering comprises performing a sigma-delta modulation operation on the in-phase and quadrature modulated signal samples.

8. The method of claim 1, further comprising computing absolute values of the in-phase and quadrature modulated signal samples prior to time-dithering such that time-dithering is performed on absolute values of the in-phase and quadrature modulated signal samples.

9. The method of claim 1, further comprising computing absolute values of the resolution-increased versions of the in-phase and quadrature modulated signal samples.

10. The method of claim 9, wherein selecting is based on the resolution-increased versions of the in-phase and quadrature modulated signal samples after time-dithering of the in-phase and quadrature modulated signal samples.

11. A digital quadrature transmitter, comprising:
   a radio frequency digital-to-analog converter (RFDAC) configured to upconvert a plurality of pairs of in-phase and quadrature modulated signal samples that are successively applied to the RFDAC;
   a phase selector unit configured to receive a plurality of phases of a local oscillator signal and to select for supply to the RFDAC one of the plurality of phases according to a quadrant determined by signs of a given pair of in-phase and quadrature modulated signal samples;
   a thermometer encoder for each of in-phase and quadrature signal paths, wherein each thermometer encoder translates modulated signal samples to thermometer coded outputs that are supplied to the RFDAC to select transistors to be turned on in the RFDAC; and
   a sigma-delta modulator for each of the in-phase and quadrature signal paths, wherein each sigma-delta modulator is configured to time-dither the in-phase and quadrature modulated signal samples, respectively, to produce resolution-increased versions of the in-phase and quadrature signal samples.

12. The transmitter of claim 11, wherein the RFDAC comprises a plurality of transistors for a positive RFDAC output and a plurality of transistors for a negative RFDAC output, and wherein the phase selector unit is configured to select a phase of the local oscillator signal to be coupled to one or more of the plurality of transistors for the positive RFDAC output and for the negative RFDAC output that are turned on.

13. The transmitter of claim 12, wherein the phase selector unit is configured to, for a given pair of in-phase and quadrature modulated signal samples:
- select a first phase when the in-phase modulated signal sample is greater than zero and the modulated quadrature signal sample is greater than zero;
- select a second phase when the in-phase modulated signal sample is less than zero and the quadrature modulated signal sample is greater than zero;
- select a third phase when the in-phase modulated signal sample is less than zero and the quadrature modulated signal sample is less than zero; and
- select a fourth phase when the in-phase modulated signal sample is greater than zero and the quadrature modulated signal sample is less than zero.

14. The transmitter of claim 11, further comprising absolute value computation blocks for each of the in-phase and quadrature signal paths configured to compute absolute values of the in-phase and quadrature modulated signal samples prior to the sigma-delta modulators such that the sigma-delta modulators operate on absolute values of the in-phase and quadrature modulated signal samples, respectively.

15. The transmitter of claim 11, wherein the phase selector unit is configured to select the phase of the local oscillator signal based on the resolution-increased versions of the in-phase and quadrature modulated signal samples.

16. The transmitter of claim 11, further comprising absolute value computation blocks for each of the in-phase and quadrature signal paths configured to compute absolute values of the resolution-increased versions of the in-phase and quadrature modulated signal samples.

17. The transmitter of claim 11, wherein the phase selector unit comprises a look-up table that maps possible combinations of signs of a pair of in-phase and quadrature modulated signal samples to a corresponding phase of the local oscillator signal.

* * * * *